United States Patent [19]

Currier et al.

[11] Patent Number: 4,811,165
[45] Date of Patent: Mar. 7, 1989

[54] ASSEMBLY FOR CIRCUIT MODULES

[75] Inventors: David W. Currier, Algonquin; Pavel Pesek, Rolling Meadows, both of Ill.

[73] Assignee: Motorola, Inc., Schaumburg, Ill.

[21] Appl. No.: 129,566

[22] Filed: Dec. 7, 1987

[51] Int. Cl.$^4$ ............................................. H05K 7/20
[52] U.S. Cl. ................................... 361/386; 361/395; 361/398; 361/399; 361/413; 439/76; 439/77
[58] Field of Search ........... 174/16 HS, 35 R, 35 GC; 361/386–389, 394, 395, 398, 399, 413, 424; 439/67, 76, 77, 494–495, 499

[56] References Cited

U.S. PATENT DOCUMENTS

| | | | |
|---|---|---|---|
| 3,873,889 | 3/1975 | Leyba | 361/398 |
| 4,689,721 | 8/1987 | Damerow et al. | 361/413 |

FOREIGN PATENT DOCUMENTS

| | | | |
|---|---|---|---|
| 2262729 | 7/1974 | Fed. Rep. of Germany | 361/398 |
| 0657679 | 4/1979 | U.S.S.R. | 361/398 |

Primary Examiner—A. D. Pellinen
Assistant Examiner—Gregory D. Thompson
Attorney, Agent, or Firm—John H. Moore

[57] ABSTRACT

The assembly includes a heat-conductive plate onto which a pair of circuit modules are mounted, one module on each side of the plate. A continuous piece of flexible material, such as polyimide, forms the substrate for one circuit module, passes around an edge of the plate, and connects to the other circuit module for which it also forms the substrate. Conductors carried by the flexible material interconnect the modules and also connect the modules to external devices via a connector.

6 Claims, 2 Drawing Sheets

ASSEMBLY FOR CIRCUIT MODULES

FIELD OF THE INVENTION

This invention pertains generally to electronic circuit modules, and more particularly to techniques for enclosing or packaging such circuit modules.

BACKGROUND OF THE INVENTION

Manufacturers of electronic equipment frequently aim to make their equipment as compact as possible. To do that, the circuit boards or modules that form the inner workings of the electronic equipment must also be made compact. This latter requirement can be met by using flexible, polyimide substrates (sometimes referred to as "flex circuits") on which individual circuit components are mounted. The ability to bend such flex circuits without damage allows them to be assembled in relatively small packages compared to the size of the packages required to hold conventional rigid printed circuit modules. A publication entitled "Flexible Circuitry Design Guide" from Sheldahl, Inc. (Copyright 1984) illustrates the use of such flex circuits.

Another factor which must be considered in designing a compact assembly for electronic circuit modules is the extent to which the assembled circuit modules need to be shielded from EMI (electro-magnetic interference). Such EMI may be generated by other nearby electronic equipment or by one of the assembled circuit modules. In either case, the need to provide shielding from EMI usually results in a large, less compact assembly and a correspondingly larger housing for the assembly.

The problem is compounded in the case where one or more of the enclosed electronic modules requires a relatively massive heat sink. To enclose one or more of such heat sinks with the circuit modules, while also providing EMI shielding, has required an undesirably large housing.

OBJECTS OF THE INVENTION

It is a general object of the invention to provide an improved packaging technique for electronic circuit modules.

It is a more specific object of the invention to provide an assembly for circuit modules that provides EMI shielding, good heat transfer characteristics, and a compact housing for the modules.

DESCRIPTION OF THE PREFERRED EMBODIMENT

Figure 1:
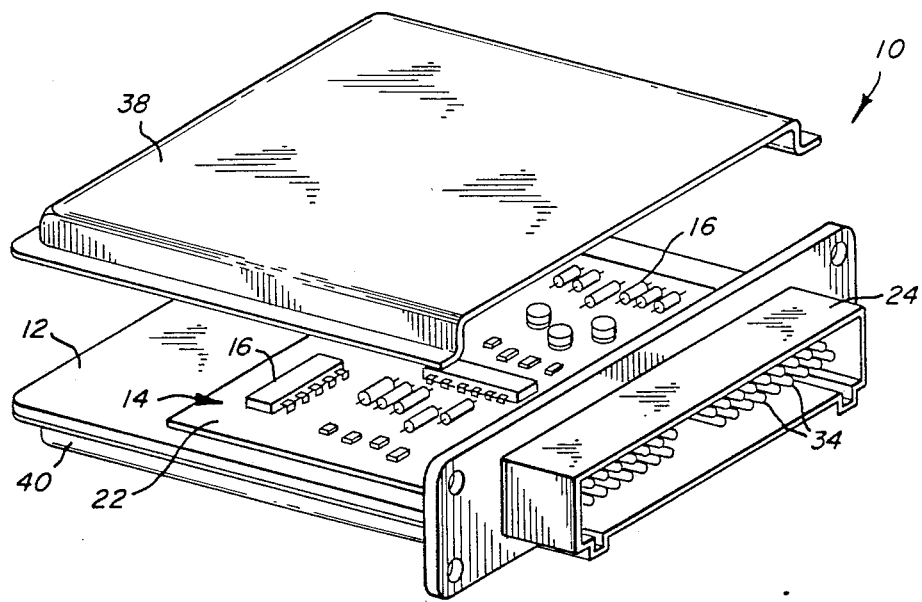
FIG. 1 is a perspective view, partly exploded, showing an assembly for electronic circuit modules according to the invention.
Figure 3:
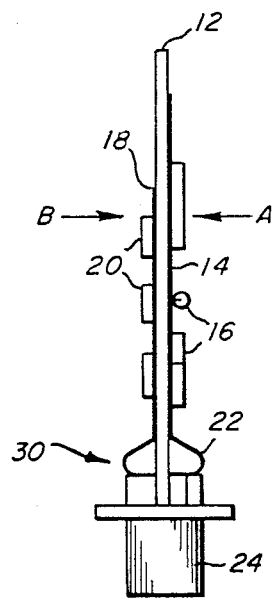
FIG. 3 is a side view of the assembly shown in FIG. 1, but with the covers removed from the assembly.

Referring to FIG. 1, an assembly 10 is shown which houses a pair of electronic circuit modules in a compact manner, while also providing EMI shielding and good heat sinking for the modules. The assembly 10 includes a flat, heat conductive plate 12, preferably made from aluminum. Mounted on the plate 12 is a first circuit module 14 which includes a plurality of electronic components 16. A seocnd circuit module 18 is mounted on the other side of the plate 12, as shown in FIG. 3, for carrying another plurality of electronic components 20.

Each circuit module 14, 18 includes a substrate made from a flexible material 22, preferably a polyimide. Both sides of the polyimide may be covered with an acrylic coating having a thickness of about 1.5 mils. Copper (about 2.6 mils thick) may be selectively plated over the acrylic layer to define conductive patterns. As discussed in more detail below, the substrate material 22 extends continuously from one circuit module to the other so that the same continuous piece of material (polyimide, e.g.) forms a part of each circuit module.

As shown in FIG. 1, this material 22 is the substrate material on which the components 16 are mounted. The substrate material 22 is itself mounted to the plate 12. Alternately, a thin aluminum plate (not shown) may be mounted directly underneath that part of the material 22 which carries the components 16, the purpose being to render the substrate more rigid and, therefore, easier to handle while the components 16 are being mounted on it, and prior to it being attached to the plate 12. The thin aluminum plate, if used, may be bonded to the larger plate 12 by adhesive.

The same flexible material 22 that forms the substrate for the module 14 extends beyond the module 14 (see FIGS. 1, 2 and 3) toward a connector 24 which is used to connect the circuit modules to external devices. Near where the connector 24 is mounted, the plate 12 has an edge 26 (FIG. 2) that extends across the full width of the plate 12. An arm 28 extends beyond the edge 26 to form a support to which the connector 24 is mounted. Between the edge 26 and the arm 28, the substrate material 22 is formed into a loop 30 which passes around the edge 26 to the other side of the plate 12 where it forms the substrate for the other circuit module 18.

In FIG. 3, the circuit module 14 is shown as being mounted on side A of the plate 12, and the circuit module 18 is shown as being mounted on side B of the plate 12. The substrate material 22 forms the substrate for the circuit module 18 on side A, and continues downwardly in FIG. 3 to form the loop 30. The same piece of flexible substrate material 22 extends upwardly from the loop 30 on side B to form the substrate for the circuit module 18. Thus, a continuous piece of material 22 is used to form substrates for both circuit modules 14 and 18.

Figure 2:
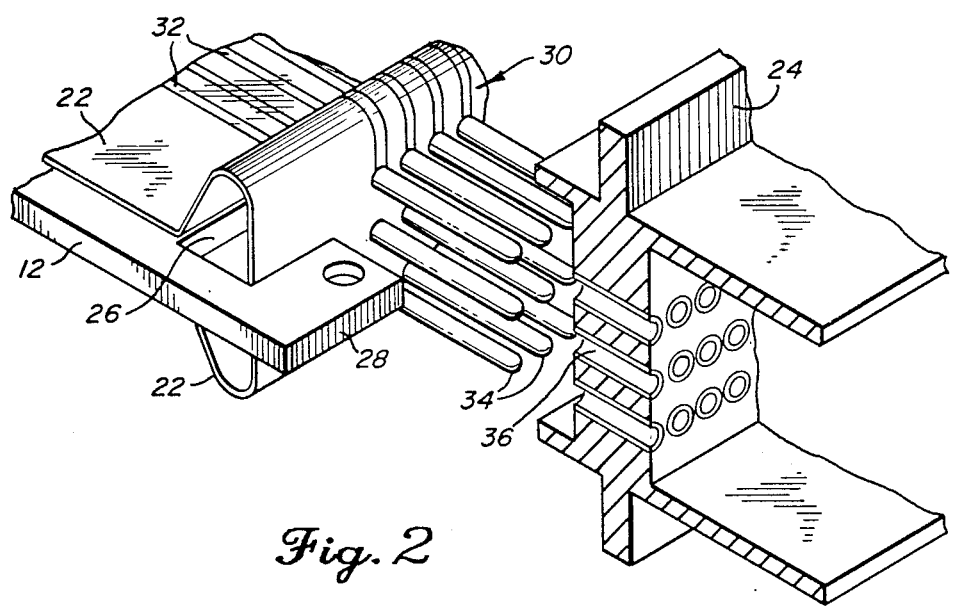
FIG. 2 illustrates terminations carried by the assembly of FIG. 1, plus a connector which mates with the terminations.

Another function of the material 22 is to hold terminations or pins to which the connector 24 may be mated. As best shown in FIG. 2, a plurality of conductors 32 are formed in or on the material 22. Some of these conductors may continue around the loop 30 to connect components on side A (FIG. 3) to different components on side B. Other conductors 32 connect components on side A to terminations 34, and other such conductors connect components on side B to other such terminations 34. Thus, the loop 30 carries some conductors 32 which form interconnects between the circuit modules and other conductors which connect to the terminations 34. In the illustrated embodiment, the terminations 34 are in the form of pins which are soldered into thru-holes formed in the material 22. The connector 24 carries holes 36 which mate with the terminations 34 so that the connector may connect the circuit modules to external devices. With this arrangement, the connector 24 is situated substantially in the plane of the plate 12, thus helping to provide a compact assembly.

Referring again to FIG. 2, the material 22 may be stiffened in the area where the material forms the loop 30. Such stiffening may be accomplished by adhering another layer of polyimide (about 5 mils thick) or other suitable material to the flexible material 22 in the area where the loop is formed.

Referring back to FIG. 1 again, the assembly 10 preferably includes a pair of covers 38, 40. The cover 38 covers the circuit module 14 and may be secured along its edges to the periphery of the plate 12. The cover 40 covers the other circuit module 18 and may be held in place in the same manner.

One of the advantages of the assembly 10 is that it provides a compact housing for two circuit modules. Moreover, the plate 12 that separates the modules provides protection from EMI so that even relatively "noisy" circuit modules can occupy the same assembly without undue interference between them. Further, the plate 12 provides a relatively massive heat sink for the circuit modules so that either circuit module may include power devices.

Figure 4:
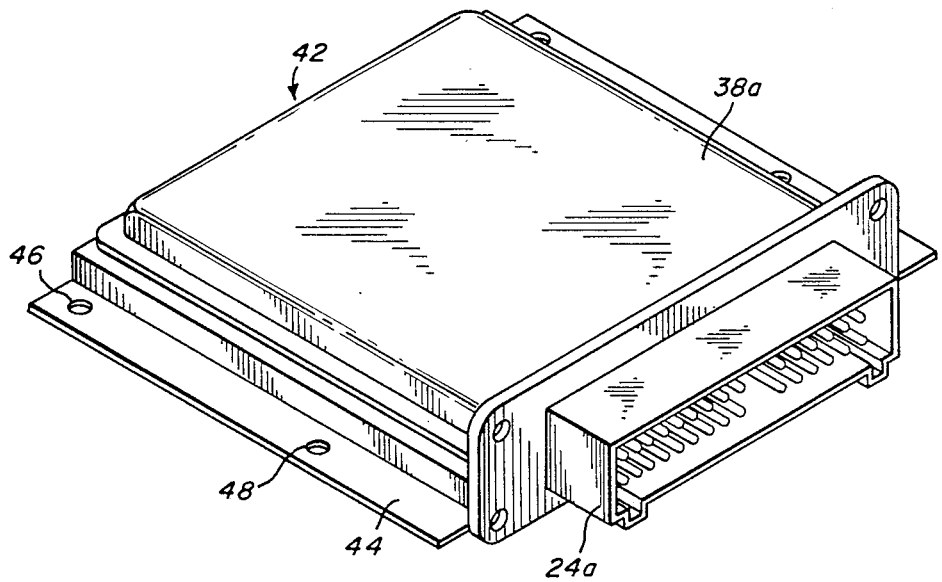
FIG. 4 is a perspective view of another embodiment of the assembly.

Alternate embodiments of the invention which also provide the advantages discussed above are shown in FIGS. 4 and 5. Referring first to FIG. 4, the assembly 42 may be constructed as described above, including a top cover 38a and a connector 24a. The assembly 42 differs from the embodiments described above in that it includes a pair of "gull-wing" mounting feet. In the illustrated embodiment, one mounting foot 44 is shown extending along the edge of the assembly 42. It attaches to the adjacent edge of an interior plate (corresponding to plate 12), and aperatures 46 and 48 are provided to permit the assembly to be screw-mounted to a support (not shown). A similar mounting foot (not shown) is attached to the other side of the assembly 42.

Figure 5:
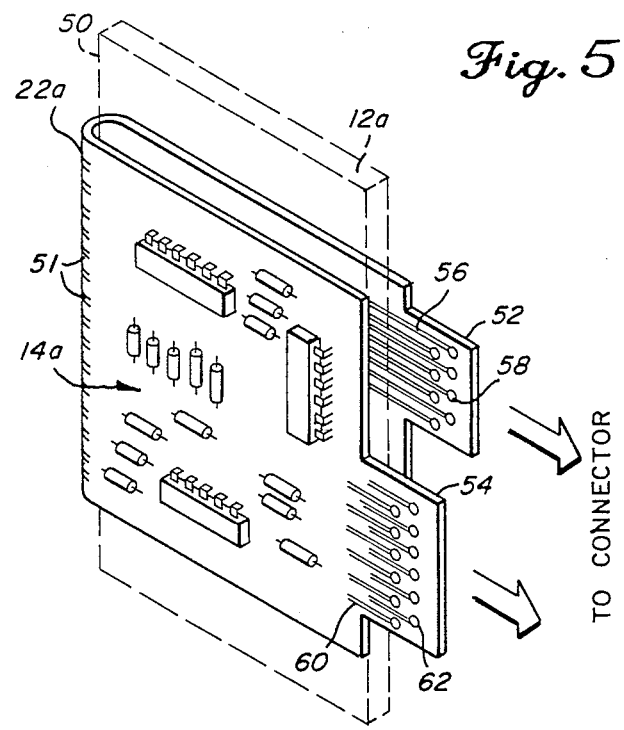
FIG. 5 is a perspective view showing an alternate feature of the invention.

Referring now to FIG. 5, the interior of another assembly is shown for the purpose of illustrating an alternate arrangement for the flexible substrate material 22a. In this case, the composition of the material 22a may be the same as for the material 22. The difference is that the arrangement shown in FIG. 5 permits a greater number of interconnections between circuit modules that are on opposite sides of the heat conductive plate 12a.

As shown, a circuit module 14a is mounted on the illustrated side of the plate 12a. Another circuit module (not shown) is mounted on the opposite side of the plate 12a. The material 22a forms the substrate for the module 14a, as well as for the module on the opposite side of the plate 12a. The difference between the arrangements of FIG. 1 and FIG. 5 is that, in the latter, the material 22a wraps around an edge 50 of the plate 12a which is opposite the edge where a connector is to be situated. As shown, the material 22a forms the substrate for the module 14a, wraps around the edge 50 and extends to the circuit module on the other side of the plate 12a to form a substrate for that other circuit module. That portion of the material 22a that wraps around the edge 50 carries conductors 51 that interconnect the two circuit modules.

To connect the circuit modules to external devices, the material 22a includes a pair of protrusions 52 and 54. The protrusion 52 carries conductors 56 between the non-illustrated circuit module and terminations 58 which are shown as thru-holes in the protrusion 52. Connector pins, such as shown in FIG. 2, may be inserted in each termination 58 for mating with a connector.

Likewise, the protrusion 54 carries conductors 60 that connect the circuit module 14a to terminations 62. The terminations in both protrusions 52 and 54 may be coupled to the same connector (not shown).

The advantage of the arrangement shown in FIG. 5 is that many more conductors (51) are available to form interconnects between circuit modules, compared to the arrangement shown in FIGS. 1–3. Of course, the arrangement of FIG. 5 retains the common advantages of providing a compact assembly for multiple circuit boards, EMI protection, and good heat sinking. The FIG. 5 arrangement also preferably uses covers such as 38 and 40 (FIG. 1) and, as mentioned previously, a conventional connector for protrusions 52 and 54.

Although the invention has been described in terms of preferred structures, it will be obvious to those skilled in the art that many alterations and variations may be made without departing from the invention. Accordingly, it is intended that all such alterations and variations be considered as within the spirit and scope of the invention as defined by the appended claims.

What is claimed is:

1. An assembly for electronic circuit modules, comprising:
   a rigid, heat conductive plate having a first side, a second side, and a plurality of edges;
   a plurality of conductors carried by the substrate material and connected to the first and second circuit modules;
   terminations for the conductors located in the loop of substrate material;
   a connector coupled to the terminations for electrically connecting the conductors to external devices; and
   a pair of covers, one cover being secured over the first circuit module and the other cover being secured over the second circuit module.

2. An assembly for electronic circuit modules, comprising:
   a heat conductive plate having a first side, a second side, and a plurality of edges;
   a first circuit module mounted on the plate's first side;
   a second circuit module mounted on the plate's second side;
   a flexible substrate material forming part of the first circuit module, extending from the first circuit module to one edge of the plate, at which edge a loop of substrate material is formed, the substrate material extending further to the second circuit module which the substrate material also forms a part of;
   a second plurality of conductors carried by the substrate material extending between the second circuit module and the second protrusion;
   a third plurality of conductors carried by the substrate material so as to form connections extending between the first and second circuit modules; and
   terminations for the conductors formed in the first and second protrusions so that a connector may be coupled thereto to connect the first and second plurality of conductors to external devices.

3. An assembly for electronic circuit modules, comprising:

United States Patent [19]

Alvarez et al.

[11] Patent Number: 4,811,166

[45] Date of Patent: Mar. 7, 1989

[54] HEAT DISSIPATING MEMBER FOR MOUNTING A SEMICONDUCTOR DEVICE AND ELECTRICAL CIRCUIT UNIT INCORPORATING THE MEMBER

[75] Inventors: Juan M. Alvarez, Medfield; Henry F. Breit, Attleboro; Steven E. Levy, Plainville; Premkumar R. Hingorany, Foxboro, all of Mass.

[73] Assignee: Texas Instruments Incorporated, Dallas, Tex.

[21] Appl. No.: 881,427

[22] Filed: Jul. 2, 1986

[51] Int. Cl.⁴ .................................................. H05K 7/20
[52] U.S. Cl. .......................................... 361/386; 357/81
[58] Field of Search ............... 361/386, 388, 400, 408; 357/81

[56] References Cited

U.S. PATENT DOCUMENTS

| | | | |
|---|---|---|---|
| 3,097,329 | 7/1963 | Siemens | 357/67 |
| 3,187,226 | 6/1965 | Kater | 361/388 X |
| 3,351,700 | 11/1967 | Savolainen et al. | 174/506 |
| 3,399,332 | 8/1968 | Savolainen | 351/81 |
| 3,684,464 | 8/1964 | Happ et al. | 128/614 |
| 4,141,029 | 2/1979 | Dromsky | 357/70 |
| 4,283,464 | 8/1981 | Hascoe | 357/81 |
| 4,363,076 | 12/1982 | McIver | 361/408 X |
| 4,472,762 | 9/1984 | Spinelli et al. | 361/388 X |
| 4,480,013 | 10/1984 | Doi et al. | 428/616 |
| 4,546,409 | 10/1985 | Yoshino et al. | 357/81 X |
| 4,546,406 | 10/1985 | Spinelli et al | 361/386 |
| 4,602,314 | 7/1986 | Broadbent | 357/81 X |
| 4,628,407 | 12/1986 | August et al. | 361/388 |

Primary Examiner—G. P. Tolin
Assistant Examiner—A. Jonathan Wysocki
Attorney, Agent, or Firm—James P. McAndrews; John A. Haug; Melvin Sharp

[57] ABSTRACT

A heat dissipating pad or support member for mounting a semiconductor device in an electrical circuit has a metal core with a relatively low coefficient of thermal expansion preferably lower than that of the semiconductor device and has a thermally conducting, corrosion resistant metal coating with relatively greater thermal conductivity than the core. The thermally conducting coating is metallurgically bonded to top, bottom and two lateral surfaces of the core with a selected thickness to cooperate with the core in providing an outer surface portion of the member over the top of the core having an effective coefficient of thermal expansion substantially corresponding to the semiconductor device to reliably mount the semiconductor device thereon. The coating is thicker on at least one of the two lateral core surfaces so that heat collected from the semiconductor device at the top surface of the thermally conducting coating is efficiently transferred via the lateral surface or surfaces on the core to the portion of the thermally conducting coating on the bottom surface of the member.

11 Claims, 1 Drawing Sheet

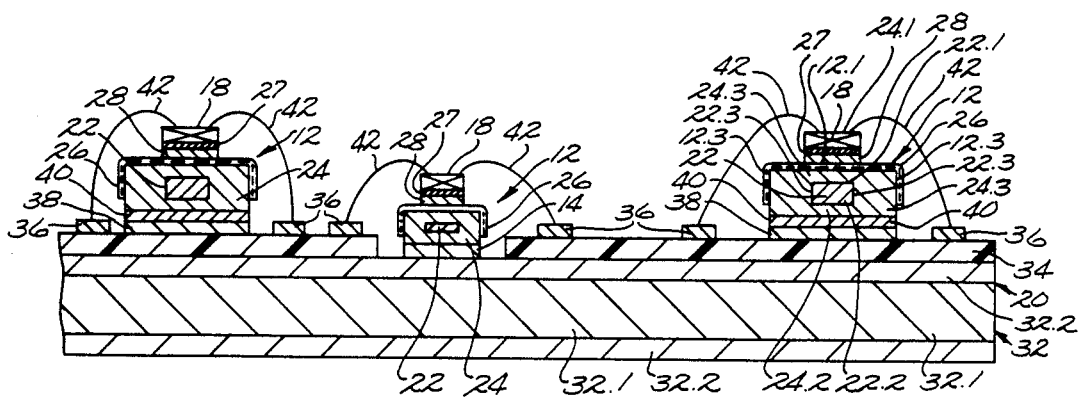

UNITED STATES PATENT AND TRADEMARK OFFICE
CERTIFICATE OF CORRECTION

PATENT NO. : 4,811,165

DATED : March 7, 1989

INVENTOR(S) : Currier, et al.

It is certified that error appears in the above-identified patent and that said Letters Patent is hereby corrected as shown below:

Claim 1: Col. 4, line 32, cancel beginning with "a plurality of" to and including "over the second circuit module" in line 42, and insert the following therefor:

a first circuit module mounted on the plate's first side;

a second circuit module mounted on the plate's second side;

a flexible substrate material forming part of the first circuit module, extending from the first circuit module to one edge of the plate, at which edge a loop of substrate material is formed, the substrate material extending further to the second circuit module which the substrate material also forms a part of;

a plurality of conductors carried by the substrate material and connected to the first and second circuit modules;

terminations for the conductors located in the loop of substrate material and extending in a direction substantially parallel to the plane of the heat conductive plate; and a connector coupled to the terminations for electrically connecting the conductors to external devices, the connector being positioned substantially in the plane of the heat conductive plate.

UNITED STATES PATENT AND TRADEMARK OFFICE
CERTIFICATE OF CORRECTION

PATENT NO. : 4,811,165

DATED : March 7, 1989

INVENTOR(S) : Currier et al.

It is certified that error appears in the above-identified patent and that said Letters Patent is hereby corrected as shown below:

Claim 2: Col. 4, line 57, cancel beginning with "a second plurality" to and including "external devices" in line 66, and insert the following therefor:

a plurality of conductors carried by the substrate material and connected to the first and second circuit modules;

terminations for the conductors located in the loop of substrate material;

a connector coupled to the terminations for electrically connecting the conductors to external devices; and a pair of covers, one cover being secured over the first circuit module and the other cover being secured over the second circuit module.

UNITED STATES PATENT AND TRADEMARK OFFICE
CERTIFICATE OF CORRECTION

PATENT NO. : 4,811,165

DATED : March 7, 1989

INVENTOR(S) : Currier, et al.

It is certified that error appears in the above-identified patent and that said Letters Patent is hereby corrected as shown below:

Claim 3: Col. 5, line 22, cancel beginning with "a first circuit module" to and including "heat conductive plate" in line 43, and insert the following therefor:

a second plurality of conductors carried by the substrate material extending between the second circuit module and the second protrusion;

a third plurality of conductors carried by the substrate material so as to form connections extending between the first and second circuit modules; and terminations for the conductors formed in the first and second protrusions so that a connector may be coupled thereto to connect the first and second plurality of conductors to external devices.

Signed and Sealed this

Twenty-third Day of January, 1990

*Attest:*

JEFFREY M. SAMUELS

*Attesting Officer*   *Acting Commissioner of Patents and Trademarks*